United States Patent [19]

Pommer et al.

[11] Patent Number: 4,922,376

[45] Date of Patent: May 1, 1990

[54] SPRING GRID ARRAY INTERCONNECTION FOR ACTIVE MICROELECTRONIC ELEMENTS

[75] Inventors: Richard J. Pommer, El Toro; John Chiechi, Irvine, both of Calif.

[73] Assignee: UniStructure, Inc., Irvine, Calif.

[21] Appl. No.: 335,802

[22] Filed: Apr. 10, 1989

[51] Int. Cl.[5] .............................................. H05K 7/20

[52] U.S. Cl. .................................... 361/386; 29/845; 357/79; 357/81; 361/400; 361/401; 361/408; 361/413

[58] Field of Search ................................. 357/79, 81; 361/386–389, 400, 401–403, 406, 408, 412–414; 439/65, 66, 74, 82, 91, 591, 867; 29/842, 844, 845, 854

[56] References Cited

U.S. PATENT DOCUMENTS

| | | | |
|---|---|---|---|
| 2,902,628 | 9/1959 | Leno | 361/414 |
| 3,379,938 | 4/1968 | Bywaters | 361/401 |
| 3,541,222 | 11/1970 | Parks et al. | 361/419 |
| 3,616,532 | 11/1971 | Beck | 361/408 |
| 3,680,037 | 7/1972 | Nellis . | |
| 4,050,756 | 9/1977 | Moore | 361/413 |
| 4,220,383 | 9/1980 | Scheingold . | |
| 4,278,311 | 7/1981 | Scheingold . | |

OTHER PUBLICATIONS

Markewycz, "Distribution System for Multilayer Ceramic Moduler", IBM Technical Disclosure Bulletin, 11/1976, vol. 19, No. 4, pp. 1270–1271.

Technical Disclosure Bulletin, Gagnon et al, "Plating Through-Holes", IBM 5/1969, vol. 11, No. 12, pp. 1704–1705.

"CIN APSE TM A New Patented Technology Bringing PC Interconnects to Speed", Cinch, a division of Labinal Components and Systems, Inc., 1989 (4 pages).

"The Area Array Connector: A Pinless Connection Technique for Pad Grid Array Packages", by Scott S. Simpson, 1987 (8 pages).

"Fuzz Buttons TM Wire Mesh Resilient Contact Elements", reprint from Quest through the courtesy of TRW, Inc. Electronics and Defense Sector, Redondo Beach, CA 90278 (9 pagess).

"Fuzz Button TM Conductive Connector", Data Sheet FB-320, Aug. 1974, Technical Wire Products, Inc., 1974 (2 pages).

*Primary Examiner*—Gregory D. Thompson

*Attorney, Agent, or Firm*—Knobbe, Martens, Olson & Bear

[57] ABSTRACT

A mechanical and electrical interconnection of an active integrated circuit to a passive substrate. The interconnection includes a contact retainer having resilient elements disposed in apertures which extend through the retainer so that the elements are radially compressed. The retainer is disposed between the active integrated circuit and the passive substrate. The retainer may be secured either mechanically or through bonding agents to the active integrating circuit and the passive substrate. Axial compression of the resilient elements upon disposing the retainer between the active integrated circuit and the passive substrate provides for wiping action of the resilient elements on the contacts of the active integrated circuit and the passive substrate. The contact retainer may include thermal paths for heat dissipation of the integrated circuits to accommodate a higher density of integrated circuits.

9 Claims, 4 Drawing Sheets

60
60
50
55
51
55
20
25
30
24
24
25
40
45
42
42
45
60
60
50
55
21
25
22
30
35
24
24
25
55
51
20
35
45
42
42
45

SPRING GRID ARRAY INTERCONNECTION FOR ACTIVE MICROELECTRONIC ELEMENTS

FIELD OF THE INVENTION

This invention relates to high density electronic interconnections, particularly to the mechanical and electrical interconnection of active electrical elements to a passive substrate.

BACKGROUND OF THE INVENTION

Integrated circuits employ active and passive elements to perform any calculating function. Active elements, such as transistors and varactor diodes, are capable of exhibiting a voltage, current or power gain in response to an external signal. The passive elements, such as resistors and capacitors, do not exhibit a voltage, current or power gain in response to external signals.

The application of active and passive elements within integrated circuits permits the integrated circuits to perform complex calculating tasks.

Because multiple integrated circuits are necessary to perform complicated tasks, the integrated circuits must act in conjunction with each other. The individual integrated circuits are affixed to a passive carrier which includes the passive circuitry to link the multiple integrated circuits. As the capability of the affixed integrated circuits increased, it became necessary to link multiple passive carriers. The linking of multiple passive carriers has been accomplished by employing wire mesh resilient contact elements or buttons. The buttons are pressed into holes in an insulating board which is then sandwiched between passive carriers to provide the electrical linking of the passive carriers.

Traditionally, solder joints have been used to provide the mechanical and electrical interconnection of active components to passive carriers. While soldering is a well-known and widely accepted means of providing electrical interconnections, soldering suffers from substantial disadvantages. Large temperature fluctuations can cause the structure of the solder joint to fail. The structural failure of a solder joint results in a failure of the electrical connection. Solder joints are also vulnerable to failure from repeated mechanical flexing which results from the use of the connections outside of a laboratory environment.

Recent developments in the electronics industry have encountered further limitations of solder joints. The miniaturization of active integrated circuits has resulted in an increased density of interconnections per unit area within the electronic devices. The physical size of a solder joint and the accessibility of the site of the joint have become limiting factors in the suitability of soldered interconnections. The size limitations of the solder connections requires that the interconnections extend beyond the periphery of the integrated circuits, thereby wasting valuable space within the device.

In addition, the creation of the hundreds of solder joints necessary to join multiple active components to a passive substrate is extremely labor intensive. There is a substantial introduction of error into an electrical system through the requirement of such labor. Further, upon failure of a single soldered interconnection, the entire component must be unsoldered so that the interconnection can be replaced or repaired. Therefore, the cost of repairing a failed interconnection may exceed the cost of the active component. This results in the disposal of valuable, working components due to the inability of the interconnections to be easily repaired.

As the size of the integrated circuits has been reduced, the density of elements has increased. This increased density has resulted in an increased density of active integrated circuits per unit area.

The pin grid array was developed to accommodate the increased density of inputs and outputs to the active integrated circuit. However, the pin grid arrays are subject to limitations arising from the ability to operably connect hundreds of pins within a small area. In addition, upon the failure of a single pin, each interconnection of the array must be broken. Therefore, repair of a failed interconnection is expensive.

In place of the pin grid array, pad grid arrays have been employed to connect the active components to a passive carrier. Pad grid arrays provide surface contacts which are blind soldered to connect the active component to the passive carrier. However, the contacts of pad grid arrays require close dimensioned tolerances so that the blind solder joint effectively connects the elements. If an interior joint does not exhibit sufficient integrity, each pad of the entire grid must be unsoldered so that the connection can be repaired.

The connection of active elements to passive carriers has developed from traditional soldered connections, to pin grid arrays and finally to pad grid arrays. Paralleling this development, the interconnection of passive carriers has evolved to include the use of resilient contact elements secured within a retainer.

Therefore, a need exists for providing a mechanical and electrical interconnection system capable of withstanding large temperature fluctuations and mechanical stresses between an active integrated circuit and a passive substrate. In addition, the need exists for a mechanical and electrical interconnection system which is neither labor intensive nor requires an interconnection area larger than the active integrated circuit.

SUMMARY OF THE INVENTION

A mechanical and electrical interconnection between an active component and a passive substrate is disclosed in which the interconnection accommodates thermal and mechanical stresses while utilizing an area within the periphery of the active component.

The present invention includes a contact retainer secured between an active component and a passive substrate. Preferably, the contact retainer comprises a composite of an insulating fiber, such as fiberglass or other suitable material. The contact retainer includes a plurality of apertures which extend through the retainer, and are sized to receive a conductive resilient element so that the element is subject to radial compression as it is disposed within the aperture. The resilient elements provide an electrical conduit through the contact retainer as it is positioned between the active component and the passive substrate.

In a preferred embodiment, the active integrated circuits are incorporated into a multichip module which cooperates with a lid to cover the circuitry and environmentally or hermetically seal the circuits. The lid is then secured by simple fasteners such as screws or bolts to the passive substrate so that the multichip module and the contact retainer are disposed between the lid and the passive substrate. Alternatively, the contact retainer may be affixed to the multichip module and this unit may then be secured to the passive substrate by means of the fasteners.

Upon the failure of an integrated circuit of the multichip module, the screws are removed and the multichip module is immediately separable from the passive substrate. Rather than unsoldering hundreds of individual interconnections of a pad grid array, the present invention provides for the separability of the multichip module from the passive substrate through the removal of screws.

The ability to immediately remove the contact retainer from between the multichip module and the passive substrate also allows for testing of the multichip module and the resilient contact elements during assembly procedures. This allows for an improved functioning percentage of manufactured units.

In addition, the resilient contact elements which provide the electrical conduit through the contact retainer are readily removable from the contact retainer. The retention of the elements by radial compression permits the extraction of an individual element without displacing other elements. Therefore, in the unlikely event that an element should fail to provide an electrical conduit through the contact retainer, the faulty element may be readily removed and replaced.

In addition, the contact elements are preferably subject to an axial bias when the contact retainer is operably secured between the multichip module and the passive substrate. The reaction of the contact elements to axial compression allows the present invention to clean interfacing electrical surfaces of oxides while withstanding the structural flexure of the multichip module or the passive substrate without jeopardizing the integrity of the electrical or mechanical interconnection.

Further, because the contact elements may be manufactured to a reduced size, hundreds of contact elements may be disposed within the area of a multichip module. Therefore, the present invention permits the interconnection of the multichip module and the passive substrate within the area of the multichip module.

The preferred embodiment also provides for dissipation of heat generated by the integrated circuits of the multichip module. Preferably, the contact retainer includes a thermal path between the multichip module and the passive substrate. Alternately, the lid of the preferred embodiment may include a protrusion which contacts the top of integrated circuits to provide a thermal path between the integrated circuit and the lid.

DETAILED DESCRIPTION OF THE PREFERRED EMBODIMENT

Figure 1:
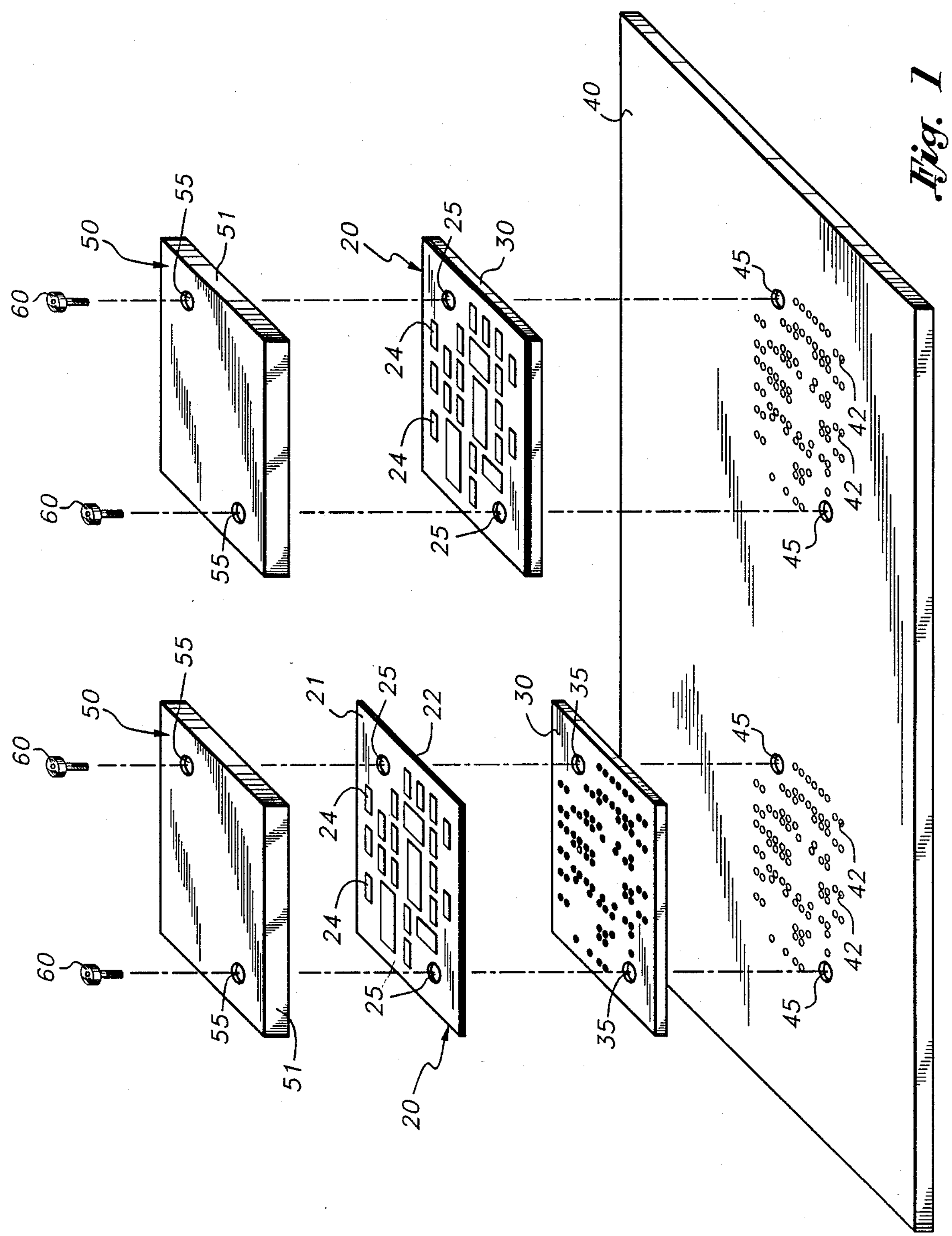
FIG. 1 is an exploded perspective of the interconnection showing the relative position of the components.

Referring to FIG. 1, a mechanical and electrical interconnection between a multichip module and a passive substrate, comprising a multichip module 20, a contact retainer 30, a passive substrate 40 and a lid 50 is disclosed. As shown in FIG. 1, the contact retainer 30 is disposed between a multichip module 20 and the passive substrate 40.

Figure 3:
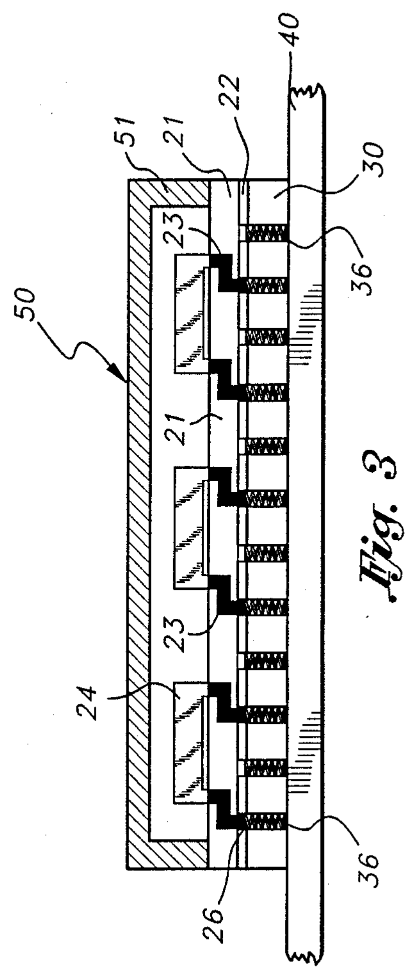
FIG. 3 is a cross-sectional view of FIG. 2 taken along lines 3—3.

The multichip module 20 is a modular assembly including a plurality of active integrated circuits 24 which are physically and electrically interconnected through an organic resin substrate 21 which provides the circuitry for interconnecting the active circuits 24. The modularity of the multichip module 20 permits the combination of inputs and outputs of each integrated circuit 24 into an efficient configuration through the resin substrate 21, thereby permitting further size reduction of the overall device. As shown in FIG. 3, the substrate 21 includes vias 23 which provide electrical pathways to the integrated circuits 24. The substrate 21 is disposed on a core 22 which provides structural rigidity for the substrate 21. The core 22 includes pads 26 which extend through the core 22 to provide an electrical conduit through the core 22. The core 22 may comprise a metal plate having a plurality of insulated holes through which the pads 26 extend. Alternatively, the core 22 may comprise a composite insulating fiber which is fabricated to include the pads 26. Also, the core 22 may comprise a ceramic material which provides the necessary structural rigidity for the substrate 21. The ceramic core includes the conductive pads 26 which provide electrical conduits to the multichip module 20.

Figure 7:
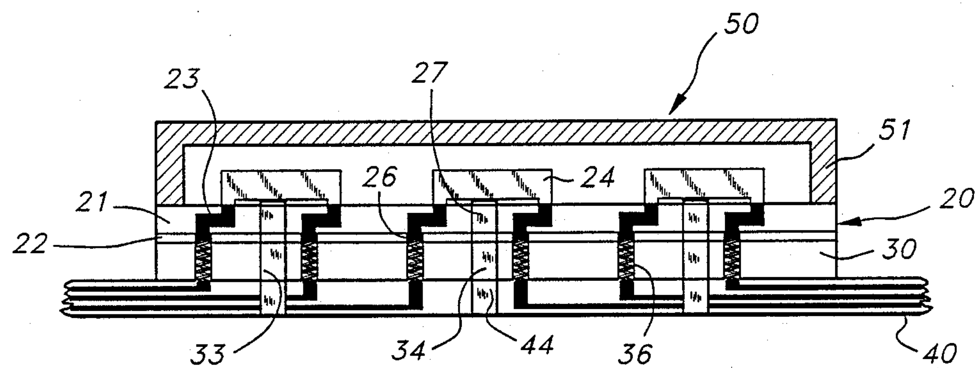
FIG. 7 is a cross-sectional view of an interconnection system showing thermal paths through the interconnection.

The passive substrate 40 is sized to engage a plurality of active multichip modules 20. The passive substrate 40 is an electrically passive element which provides the structural and electrical interconnection of the individual active multichip modules 20 so as to coordinate the functions performed by each multichip module 20 so that a larger, more complex task may be performed. Preferably, the passive substrate 40 is comprised of nonconducting composite fiberglass material having passive circuitry etched into the fiberglass composite. The passive substrate 40 may be sized to a standard configuration so that the passive substrate 40 may provide for a molecular assembly of larger electronic devices. Referring to FIG. 7, the passive circuitry of passive substrate 40 includes terminals 42 which provide the electrical interface to the contact retainer 30. Securing holes 45 are located in the passive substrate 40 to engage the fasteners 60 to secure the multichip module 20 and contact retainer 30 relative to the passive substrate 40.

As shown in FIG. 1, the contact retainer 30 is a planar sheet of insulating material having a sufficient thickness to retain a contact element 36. The retainer 30 may initially be fabricated as a solid sheet of a nonconductive composite fiber. The solid sheet may then be drilled or etched to produce the apertures 32 having the appropriate size, as discussed infra, and fastener holes 35. The apertures 32 are located so as to align with pads 26 of the core 22 and terminals 42 of the passive substrate 40 when the retainer 30 is operably aligned between the multichip module 20 and the passive substrate 40.

Figure 4:
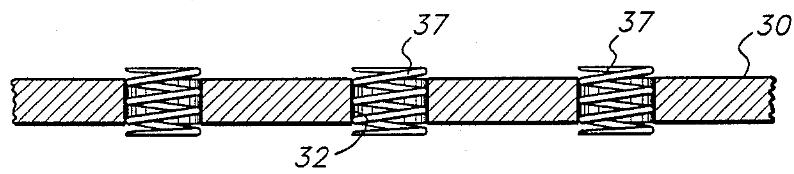
FIG. 4 is a partial cross-sectional view of a contact retainer showing a coiled element.
Figure 5:
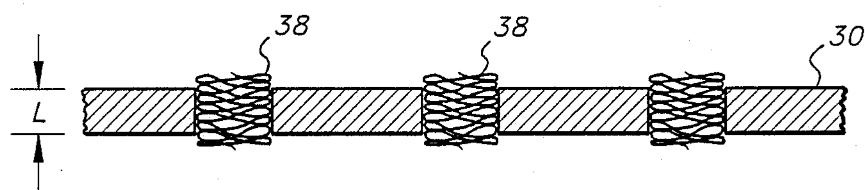
FIG. 5 is a partial cross-sectional view of a contact retainer showing a wire mesh element.
Figure 6:
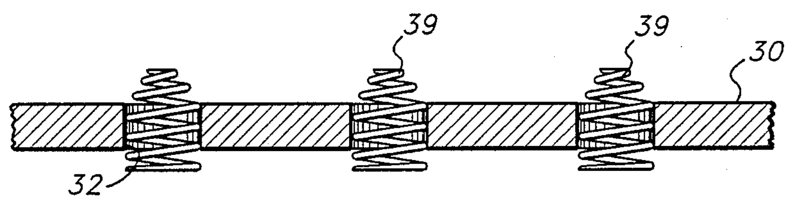
FIG. 6 is a partial cross-sectional view of a contact retainer showing a conical element.

A contact element 36 is disposed within each aperture 32. As shown in FIGS. 4, 5 and 6, the contact retainer 36 may be configured as a cylindrical coiled spring 37, a cylindrical mesh member 38 or a conical coiled spring 39. Referring to FIG. 5, the cylindrical mesh member 38 (i.e., a FUZZ BUTTON ®, manufactured by Tecknit ® Interconnection Products of New Jersey) is shown. When a mesh member 38 is employed, the diameter of the member 38 should be approximately 0.002 inches less than the diameter of the aperture 32. This configuration allows for easy insertion of the mesh member 38 within the aperture 32 while providing for sufficient radial compression of the member 38 upon operable engagement of the retainer 30 between the multichip module 20 and the passive substrate 40.

Referring to FIG. 5, the unstressed length of the mesh member 38 is approximately 25% greater than the length L of the aperture 32. Preferably, approximately 10% of the unstressed length of the element 36 extends beyond each end of the aperture 32. Upon operable engagement with the contact retainer 30, the compression of the element 38 is within the limits of elastic deformation of the element 38 so that the compressed element exerts an axial force against the multichip module 20. Because this percentage of deformation is within the elastic limits of the member 38, the member substantially returns to its unstressed length when removed from between the multichip module 20 and the passive substrate 40 . Under current fabrication techniques, the mesh members 38 are manufactured so that a 0.025 inch distance separates the centers of the nearest aperture 32. However, as will be apparent to one skilled in the art, as mesh members 38 are reduced in size, the density of interconnections of the contact retainer 32 may be increased thereby providing distances less than 0.025 inches between the centerlines of the apertures 32.

As shown in FIGS. 4 and 6, the contact element 36 may alternatively comprise a cylindrical coiled spring 37 or a conical coiled spring 39. The density of apertures 32 which employ a cylindrical or conical spring 37, 39 is determined by the size of the spring 37, 39. As manufacturing techniques provide for a reduced size of the springs 37, 39, the density of apertures 32 may increase. The cylindrical and conical springs 37, 39 are also retained within the aperture 32 by radial compression and extend beyond the planar surface of the contact retainer 30. The spring 37, 39 is inserted into an aperture 32 so that approximately 10% of the length of the unstressed element extends beyond each end of the aperture 32. As with the mesh member 38, an axial compression of approximately 25% is within the limits of elastic deformation of the cylindrical and conical springs 37, 39.

The environment in which the multichip module 20 is employed determines the appropriate configuration of the lid 50. Preferably, the lid 50 is comprised of aluminum which provides sufficient structural rigidity and is a good thermal conductor. The lid 50 includes a pair of fastener holes 55 which are employed to secure the lid 50 relative to the passive substrate 40. As shown in FIG. 3, the lid 50 includes a depending flange 51 which terminates a distance from the planar surface of the lid 50. The flange 51 is sized so that upon mounting of the lid 50 to the multichip module 20, the planar portion of the lid 50 is above the active integrated circuits 24. In addition to protecting the integrated circuits 24, the lid 50 may provide the necessary structural rigidity of the multichip module 20. If the core 22 is comprised of a material or has a thickness which does not provide sufficient structural rigidity, the lid 50 is constructed of a sufficient thickness to provide structural rigidity upon securing the multichip module 20 to the lid 50. The lid 50 is secured to the multichip module 20 through bonding agents or mechanical fasteners to provide the necessary structural rigidity of the multichip module 20.

The active integrated circuits 24 may be individually hermetically sealed relative to the resin substrate 21. The lid 50 may be secured over a hermetically sealed multichip module 20 to protect the seal. Alternatively, the integrated circuits 24 of the multichip module 20 may be hermetically sealed by sealing the lid 50 to the substrate 21 of the multichip module 20. A glass bead (not shown) seals the joint of the flange 51 of the lid 50 to the substrate 21, thereby hermetically sealing the lid 50 to the multichip module 20.

However, many commercial uses of the multichip module 20 do not require hermetic sealing. Therefore, the multichip module 20 may be environmentally sealed by potting the integrated circuits 24 and the resin substrate 21 in an insulating elastomeric material. Alternatively or additionally, the integrated circuits 24 may be disposed under a lid 50 which serves as a dust cover to protect the integrated circuits 24 from ambient particulate matter.

The contact retainer 30, having the contact elements 36 disposed within the apertures 32 is positioned between the active multichip module 20 and the passive substrate 40. As discussed supra, upon operable alignment of the contact retainer 30 and the multichip module 20, the apertures 32 are aligned with the pads 26 of the multichip module 20 and the terminals 42 of the passive substrate 40. The contact retainer 30 may be laminated or bonded to the core 22 by bonding agents well-known in the art capable of withstanding mechanical stress and temperature fluctuations. Alternatively, the contact retainer 30 may be mechanically secured to the multichip module 20 by retaining clips (not shown). The retaining clips are generally C-shaped members comprising a resilient material. The retaining clips engage the contact retainer 30 and the multichip module 20 to bias the contact retainer 30 against the multichip module 20. The securing of the contact retainer 30 to the multichip module 20 by the retaining clips axially compresses the elements 36 approximately 10% of the unstressed length of the element 36. Approximately 10% of the unstressed length of the element 36 extends beyond the planar surface of the contact retainer 30 exposed to the terminals 42 of the passive substrate 40.

Alternatively, the contact retainer 30 may remain separate from the multichip module 20 and be secured between the passive substrate 40 and the multichip module 20 by screws 60.

Figure 2:
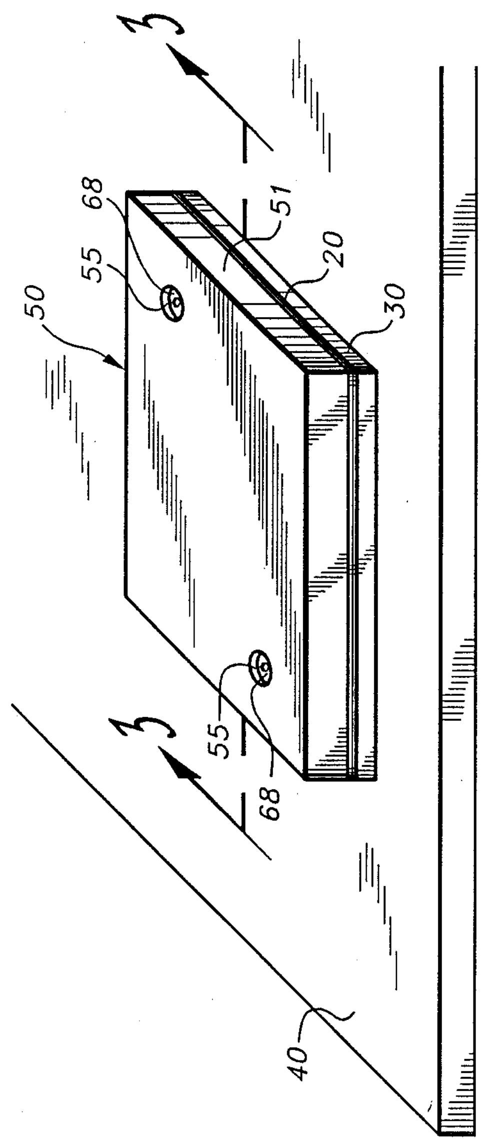
FIG. 2 is a perspective view of an assembled interconnection.

As shown in FIG. 1, screws 60 may pass through the holes 55 in the lid 50, holes 25 in the multichip module 20, the holes 35 in the contact retainer 30 and holes 45 in the passive substrate 40. The screws 60 may engage a threaded insert (not shown) within the hole 45 or engage a nut (not shown) on the passive substrate 40. The head of the screw 60 contacts the lid 50 so that the lid 50 may be drawn towards the passive substrate 40 as the screw 60 is tightened. Referring to FIG. 2, the screws 60 are tightened until the contact retainer 30 and the multichip module 20 are securely disposed between the lid 50 and the passive substrate 40. Upon this securing, the elements 36 are axially compressed approximately 25% of the unstressed length of the element 36.

Therefore, in the assembled configuration, the elements 36 exert a force against the pads 26 of the multichip module 20 and the terminals 42 of the passive substrate 40. The electrical interconnection through the contact retainer is not a rigid, fixed unit, but rather a pressure loaded contact. Upon flexure of the multichip module 20, the contact retainer 30, or the passive substrate 40, the axial force exerted by an element 36 causes a relative movement or wiping motion between the element 36 and the pad 26 and the terminal 42. This wiping action abrades oxide deposits which may accumulate on the pads 26 or the terminals 42 while maintaining the integrity of the electrical connection therebetween. Also, the ability of elements 36 to move relative to the pad 26 and the terminals 42 allows for mechanical flexure of the multichip module 20 relative to the passive substrate 40 without sacrificing the integrity of the electrical interconnection.

Referring to FIG. 7, the interconnection system also provides for thermal management of the active integrated circuits 24. The substrate 21 and core 22 includes a solid metallic pathway 27 from the integrated circuit 24 through the core 22. The pathway 27 is preferably formed integral with the core 22 and substrate 21 during fabrication. The contact retainer 30 includes copper columns 34 which extend through the retainer 30 to provide a thermal path from the pathways 27 to the passive substrate 40. The copper columns 34 are affixed within openings 33 by bonding agents or an interference friction fit. The size of the column 34 is determined by the size of the integrated circuit 24 and the heat produced by the integrated circuit 24. The greater heat to be removed from the integrated circuit 24, the larger cross-sectional area of the column 34. The passive substrate 40 also includes a thermal contact 44 which provide for the transfer of heat away from the integrated circuits 24. The thermal contact 44 is preferably of a high efficiency thermal conductor such as copper and may extend directly through the passive substrate 40. However, the thermal pathway in the passive substrate may be determined by design considerations of an electronic device.

Figure 8:
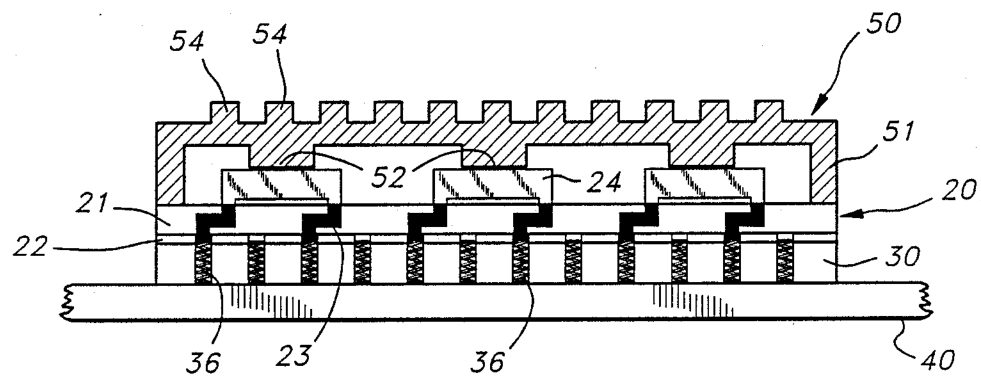
FIG. 8 is a cross-sectional view of the interconnection system showing thermal paths through the lid.

Alternatively or additionally, the lid 50 may include protrusions 52 which extend downward to contact the top of the integrated circuits 24, as shown in FIG. 8. The protrusions 52 thereby provide a thermal conduit from the active integrated circuit 24 to the lid 50. The protrusions 52 are integrally formed with the lid 50. The cross-sectional area of the protrusion 52 is a function of the heat to be transferred from the integrated circuit 24. The greater the heat to be transferred, the greater the area of contact between the protrusion 52 and the integrated circuit 24. In addition, the lid 50 may include a plurality fins 54 for increased thermal dissipation from the lid 50. Preferably, the fins 54 are integrally formed with the lid 50.

Although the present invention has been described in terms of particular embodiments, it is not limited to these embodiments. Alternative embodiments and modifications which would be encompassed by the invention may be made by those skilled in the art, particularly in light of the foregoing teachings. Alternative embodiments, modifications, or equivalents may be included within the spirit and scope of the invention as defined by the claims.

We claim:

1. A mechanical pressure contact providing electrical communication between an active circuit element and a passive substrate, comprising:

a module including at least one active element;

a contact retainer adapted to cooperatively align with said active element, said retainer including an aperture, said aperture exposed to an electrical contact on said active element upon cooperative alignment of said active element and said retainer;

a passive substrate having a surface terminal exposed to said aperture upon cooperative alignment of said retainer between said active element and said passive substrate;

a conductive resilient element disposed within said aperture, said element providing an electrical path through said retainer;

a lid sized to engage said module and enclose said active elements; and a fastener cooperatively aligning said retainer relative to said active element, said passive substrate, and said lid to deform said resilient element within its elastic limit and to secure said lid and said passive substrate.

2. The mechanical pressure contact as defined in claim 1, wherein said lid includes an aperture sized to receive said fastener so that said fastener cooperatively engages said lid and said passive substrate.

3. The mechanical pressure contact as defined in claim 1, wherein said lid includes a protrusion extending from said lid, said protrusion sized to contact said active element, wherein said protrusion provides a thermal path between said lid and said active element.

4. The mechanical pressure contact as defined in claim 1, wherein said lid includes a plurality of fins extending from said lid, said fins adapted to dissipate heat from said lid.

5. The mechanical pressure contact as defined in claim 1, wherein said active element includes a thermal pathway, and said retainer includes a thermal path member which extends through said retainer, wherein said path member contacts said thermal pathway when said active element is cooperatively aligned with said retainer; and said passive substrate including a thermal contact, said thermal contact contacting said path member when said passive substrate is cooperatively aligned with said retainer.

6. A method for providing electrical contact between an active circuit element of a module and a passive substrate, comprising:

retaining a conductive resilient element within a retainer having an aperture sized to receive said resilient element, said resilient element retained by radially compressing said resilient element within the elastic limits of deformation of said resilient element, wherein said resilient element axially aligns with an electrical contact of said active element and an electrical contact of said passive substrate when said retainer is operatively aligned with said active element and said passive substrate;

providing a lid sized to engage said module and enclose said active circuit element; and securing by means of a fastener to cooperatively align said retainer relative to said active circuit element, said passive substrate, and said lid to elastically axially deform said resilient element within the limits of elastic deformation of said resilient element.

7. The method of claim 6, wherein said resilient element comprises:

a substantially cylindrical wire mesh element having a length approximately 25 percent greater than the length of said aperture.

8. The method of claim 6, wherein said resilient element comprises:

a cylindrical coiled spring sized to be elastically compressed when disposed within said aperture.

9. The method of claim 6, wherein said resilient element comprises:

a conical coiled spring sized to be elastically compressed when disposed within said aperture.

* * * * *